United States Patent [19]
> Eaton, Jr. et al.

[11] Patent Number: 5,239,474
[45] Date of Patent: Aug. 24, 1993

[54] DIPOLE MOMENT DETECTION AND LOCALIZATION

[75] Inventors: Wilbur W. Eaton, Jr., Placentia, Calif.; Ben R. Breed, Austin, Tex.

[73] Assignee: Hughes Aircraft Company, Los Angeles, Calif.

[21] Appl. No.: 616,158

[22] Filed: Nov. 20, 1990

[51] Int. Cl.$^5$ .............................................. G01C 21/00
[52] U.S. Cl. .................................. 364/449; 364/559; 324/207.14; 324/207.26
[58] Field of Search .............................. 364/469, 559; 324/207.14, 207.26

[56] References Cited

U.S. PATENT DOCUMENTS 4,710,708 12/1987 Rorden et al. ...................... 364/449

Primary Examiner—David C. Cain
Attorney, Agent, or Firm—W. K. Denson-Low

[57] ABSTRACT

An array of magnetic sensors and a digital signal processor are used to break a target magnetic dipole field into its components, and a magnetic signature of the present magnetic field is created. Predicted target signatures are precomputed for multiple magnetic orientations of the dipole at each of a plurality of range locations, expressed in terms of Anderson functions, which are a set of equations that decompose the magnetic field in each of the magnetic response locations, and are stored in a lookup table for reference. Input data measured by the sensors are processed and each sensor's magnetic value is predicted to process against background noise using the other sensors of the array. A long term time average consistent with the relative motion of the target is computed using bandpass filtering of the signals from the sensor array. The bandpass filtered data is used to update the predicted data so that anomalies and other non-target data is removed from the signals that are processed. The data are then expressed in terms of Anderson functions. The data are matched filtered, wherein it is correlated with the stored precomputed predicted target signatures. The correlation yields a set of values that is then thresholded. If a target is present at any of the locations, then the correlated normalized value computed as stated above will be higher than the chosen threshold. The target locations that are above the threshold are then displayed on a monitor showing the relative location and dipole of orientation.

6 Claims, 7 Drawing Sheets

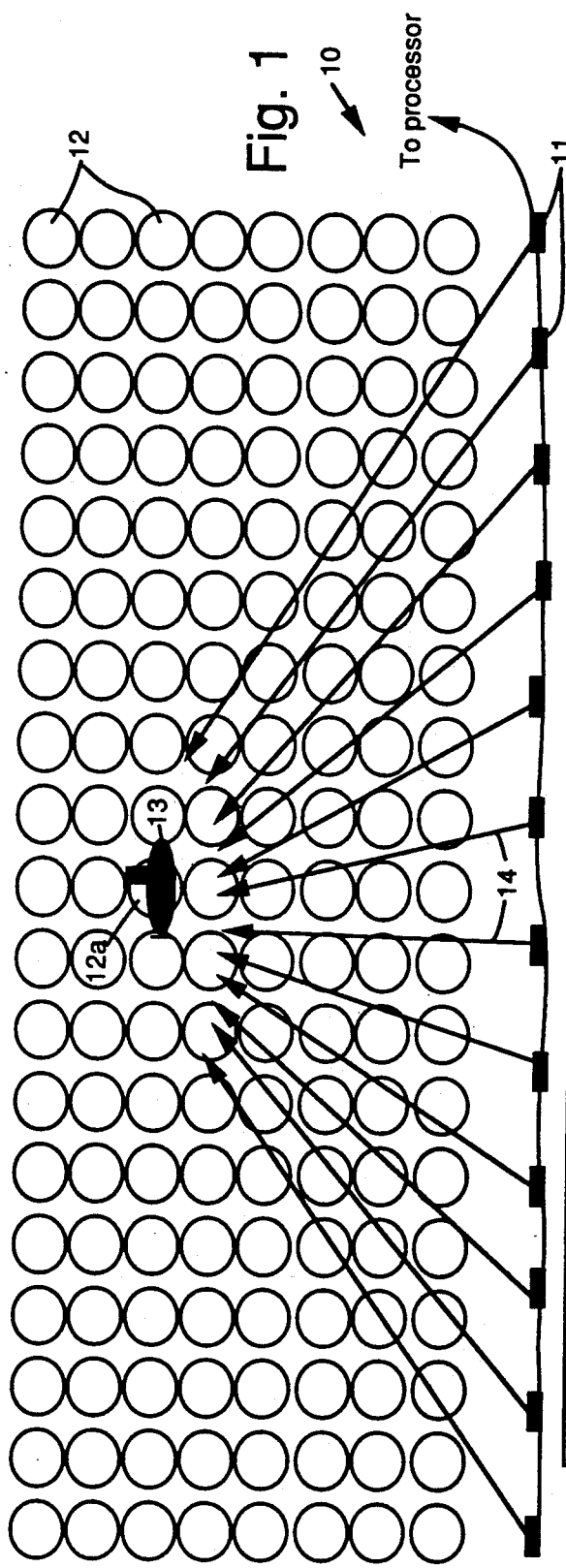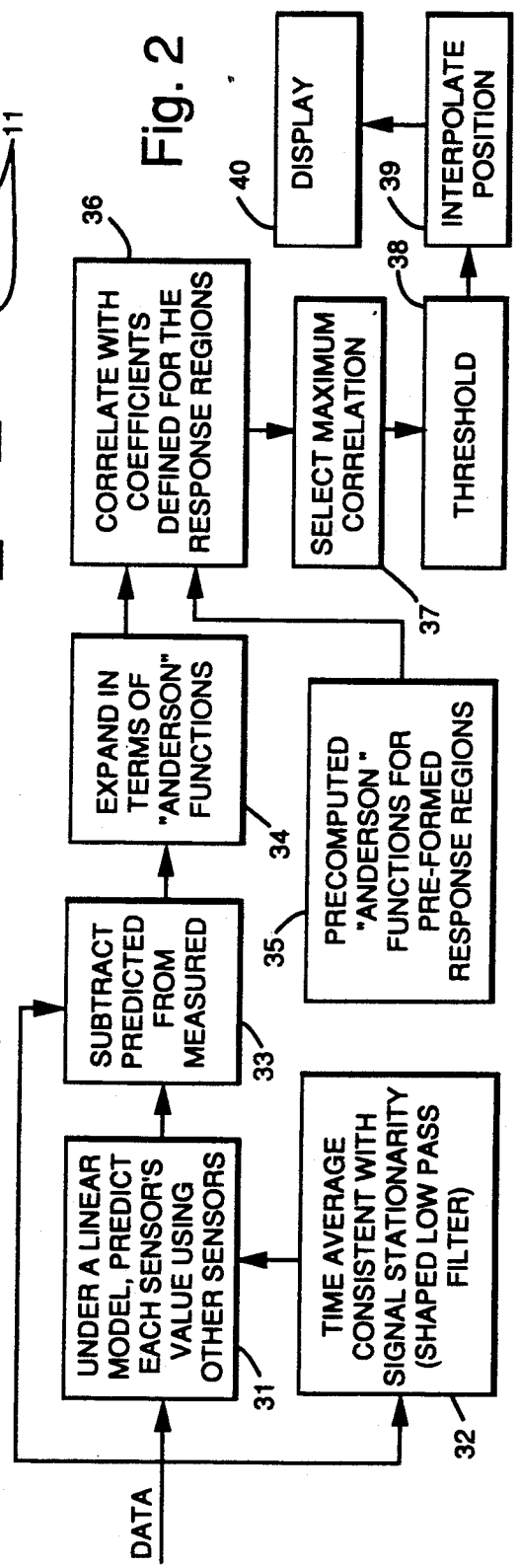

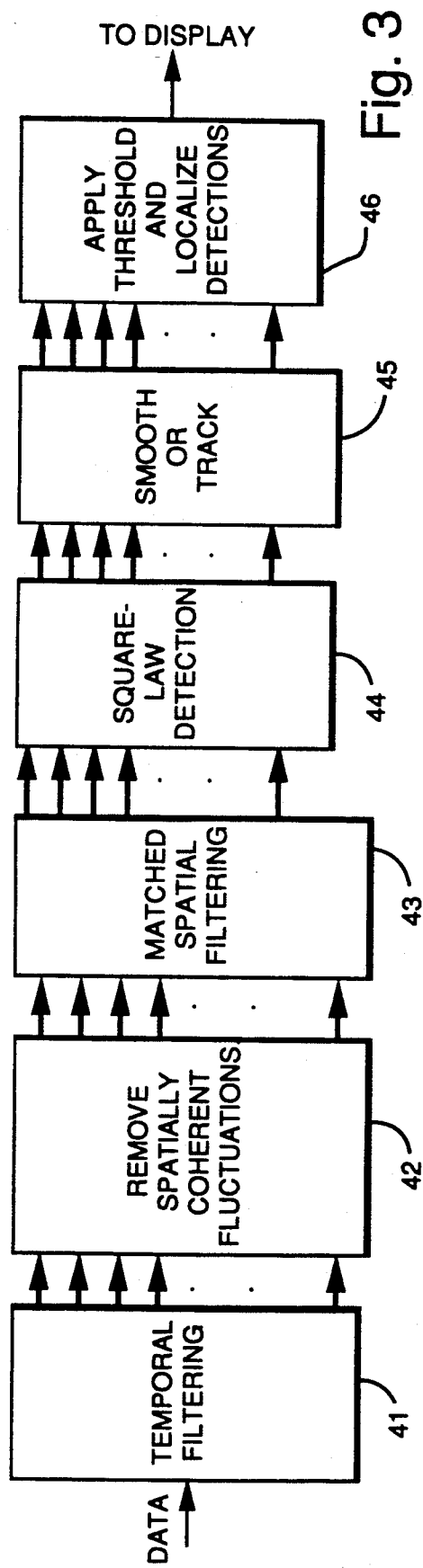
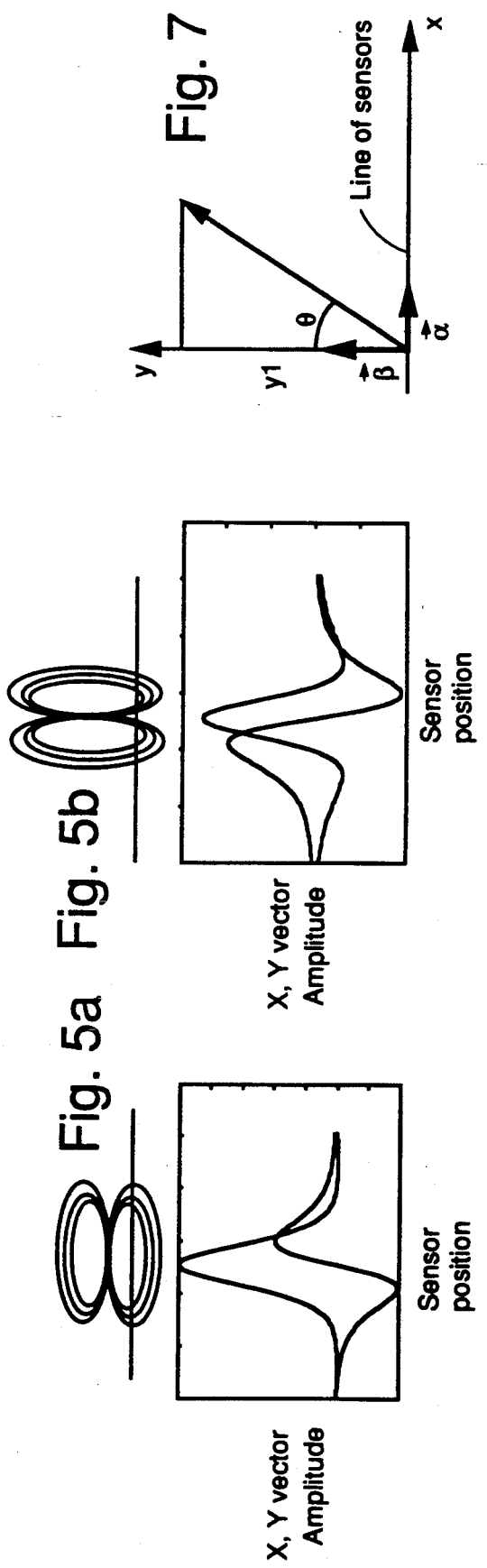

PRECOMPUTE DIPOLE ORIENTATIONS FOR EACH MAGNETIC RESPONSE LOCATION

MATCH PREDICTED ORIENTATIONS WITH SENSOR READING PRODUCT

FIELD SHAPE AND DIPOLE ORIENTATION

COMPUTE CONTRIBUTION OF EACH SENSOR TO EACH MAGNETIC RESPONSE LOCATION

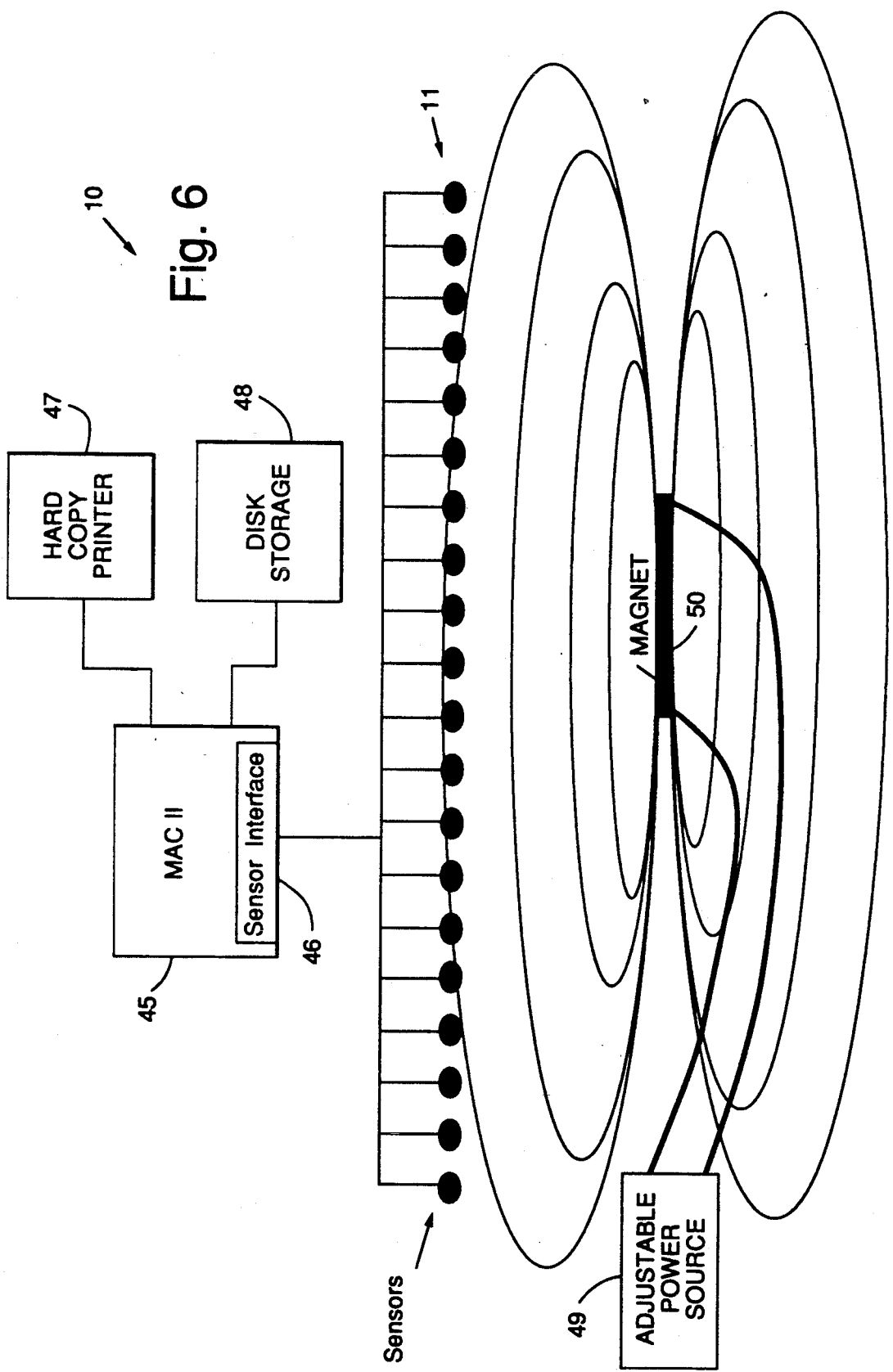

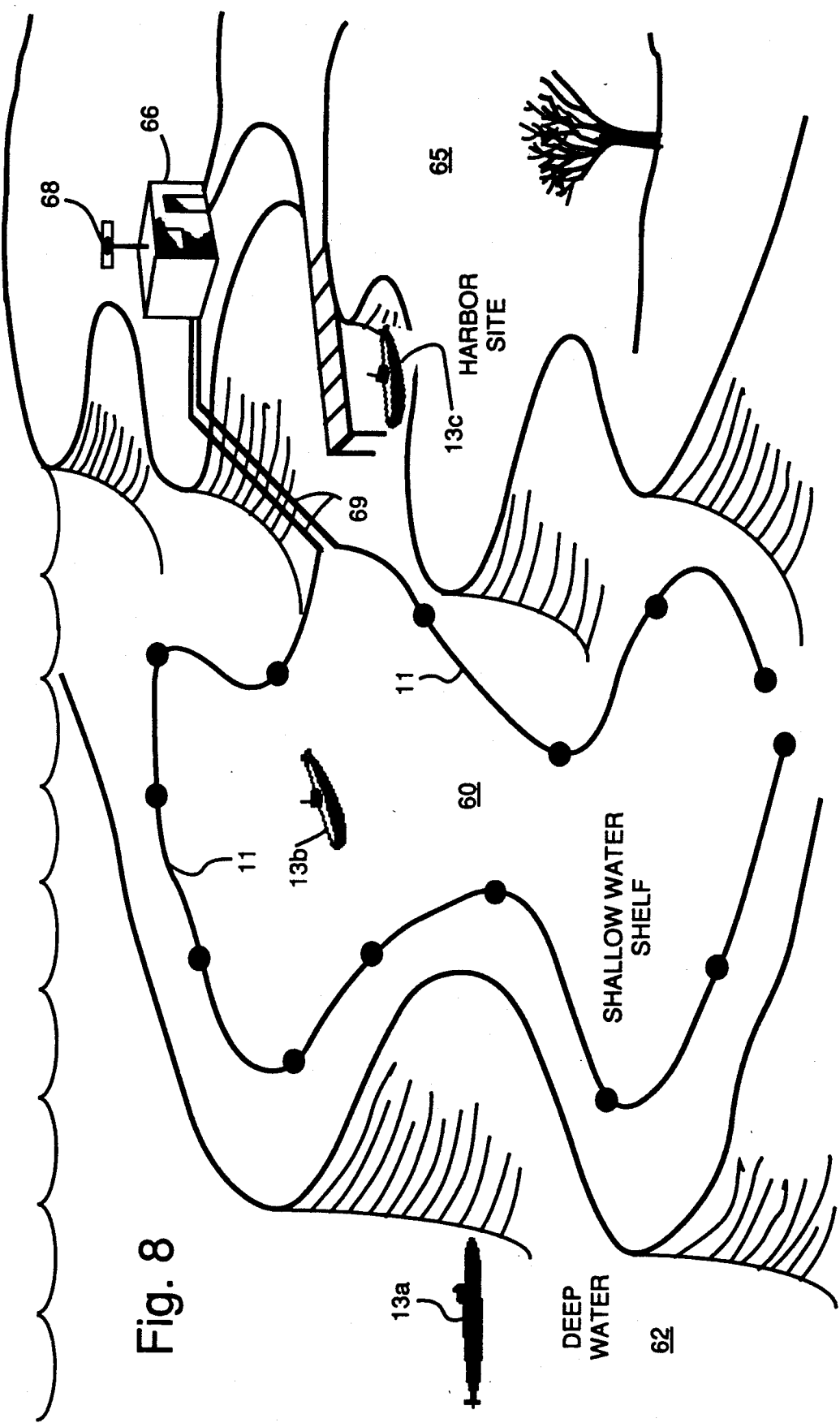

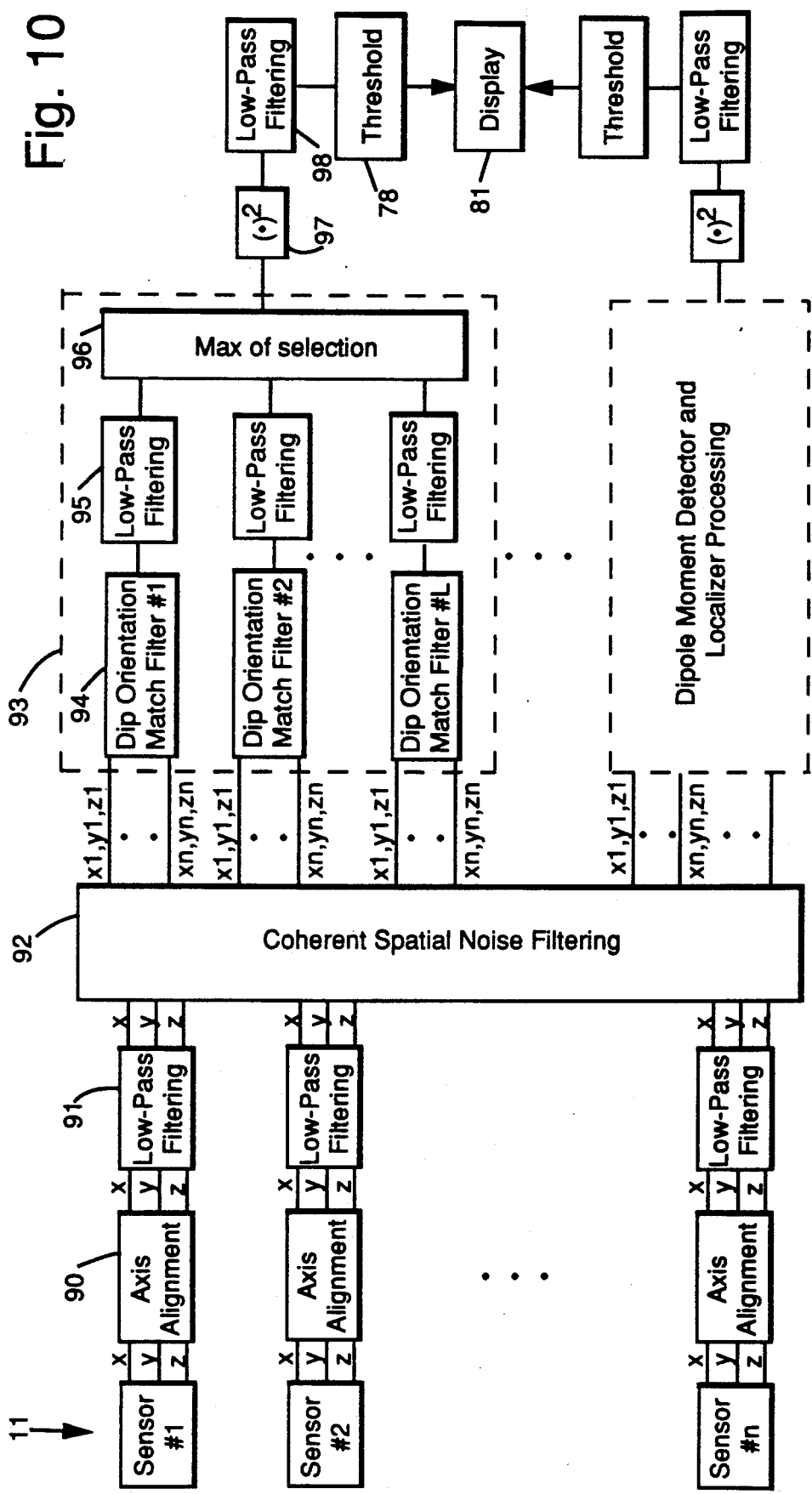

DIPOLE MOMENT DETECTION AND LOCALIZATION

BACKGROUND

The present invention relates generally to dipole moment detectors and methods of dipole detection, and more particularly, to dipole moment detectors and methods that provide for detection, localization and orientation of dipoles such as submarines and ocean going vessels, and the like.

Present magnetic anomaly detection systems employ proximity detection of a magnetic dipole. Typical of this type of system is the well known airborne magnetic anomaly detection system that is towed by a P3 aircraft, for example. In this system, detection is performed using a single sensor to detect a change in the total local magnetic field. The disadvantage of this approach is the limited amount data generated by the system, in that it provides for no target direction, no target orientation, gross localization and the system has relatively low processing gain.

SUMMARY OF THE INVENTION

The dipole moment detector and localizer of the present invention uses an array or multiple arrays of magnetic sensors and digital signal processing techniques to break a magnetic field in x, y, and z components for vector sensors and into its total field component for scalar sensors at each of a plurality of positions relative to the array of sensors. In doing this, a magnetic signature of the magnetic field of a magnetic dipole located in the field is created. This magnetic signature provides an easily recognizable feature for an automatic pattern recognizing system.

The present invention precomputes predicted target signatures for multiple magnetic orientations of the dipole at each of a plurality of range locations. Thus, for example, if the array contains 10 sensors, and if there are 8 dipole orientations (every 45 degrees) per location, and if there are 8 relative vertical distances from the sensor array and 4 distances on either side of the array at which predicted readings are computed (thus creating a 10 by 8 by 8 cube of magnetic response locations), then a total of 640 ($8 \times 8 \times 10$) predicted signatures of 30 data words each (3 for each of the 10 sensors) are computed and stored in a lookup table for reference.

Input data measured by the sensors are processed against the background ambient noise using a linear model, where each sensor's output value is predicted using other sensors of the array. Also a long term time average consistent with the relative motion of a target is computed. This amounts to bandpass filtering or long term averaging of the signals from the sensor array. The bandpass filtered data is used to update the predicted data so that anomalies and other non-target data is removed from the signals that are processed. The data is then expressed in terms of Anderson functions, which are a set of mathematical functions that decompose the magnetic field into its components in each of the magnetic response locations.

Then the data expressed in terms of the Anderson function is matched filtered, wherein it is mathematically correlated by means of a dot product with the stored precomputed predicted target signatures. The dot product, or correlation, of these two sets of data yields a set of values including the largest value in the set of correlated data and is then normalized. This normalized data is then thresholded, and if a target is present at any one of the locations, then the correlated, dot product, normalized value computed as stated above will be higher than the chosen threshold. This is true since the dot product produces relatively high values when the signatures are substantially identical, and produces relatively low values when the correlated signatures are not substantially identical.

The target locations that are above the threshold was then displayed on a monitor showing the relative location and dipole orientation. This display of the data is typically updated at 10 second intervals. In this way, anomalies and other non-target data that are detected only appear at one display interval and then disappear during the next display interval. Typical of these anomalies are sun spots and geomagnetic noise that is highly correlated. Typical of local anomalies are local spurious events, such as Eddy currents, local pressure waves, and tidal waves, and the like.

The present invention provides for a magnetic process beamformers, analogous to conventional sonar or other acoustic beamforming processes, in a fixed-sensor field vector or scalar approach. The Anderson function procedure of the present invention is analogous to the acoustics procedure of expanding a plane wave arrival in terms of a pre-formed set of receive beams. In a pattern recognition context it is an optimum linear discrimination procedure based on the expected form of the target signature.

Both vector and scalar implementations of the present invention are contemplated. The magnetometers employed in the magnetic sensors in the array may be either vector or scalar magnetometers. The vector magnetometers are three-axis directional components, while the scalar magnetometers determine only the magnitude of the local magnetic field.

Since most ocean going vessels are magnetic dipoles, the dipole moment detector and localizer may be used to detect and localize surface and sub-surface ocean going vessels. It forms a portion of a data processing system that is adapted to detect and localize ocean going vessel magnetic dipoles as they enter/exit sea ports or as they proceed over a Barrier sensor field, for example. The dipole moment detector and localizer provides for a new approach to shallow water target detection. Other applications for the dipole moment detector and localizer include battlefield management, geological survey, and harbor protection.

The advantage of the dipole moment detector and localizer is that it provides detection, localization and dipole orientation with a greater system signal processing gain over existing systems, because it uses an array of spatially distributed sensors. Most present magnetic detection systems do not provide nearly the localization inherent in the system described herein. The processing performed by the present invention allows target of interest tracking to be performed more accurately and at greater ranges than with the proximity detection employed in existing systems, such as the P3 airborne magnetic anomaly detection system.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which:

FIG. 1 is a diagram illustrating the concepts of the method and apparatus of the present invention;

FIG. 2 is a block diagram illustrating the processing flow using the method and apparatus of the present invention;

FIG. 3 illustrates the processing performed using the method and apparatus of the present invention;

FIGS. 5a and 5b illustrate signature signals for two different dipole orientations;

FIG. 6 is a diagram illustrating an embodiment of apparatus of the present invention used to test the principles of the present invention;

FIG. 7 illustrates a geometric arrangement representing a line of array of sensors along the X-axis with a particular search location defined with respect to parameters $y_1$ and theta that is useful in explaining the mathematics associated with processing performed in accordance with the present invention;

FIG. 8 illustrates a typical operational scenario utilizing the present invention;

FIG. 10 is a detailed block diagram of the system of the present invention.

DETAILED DESCRIPTION

Figure 4B:
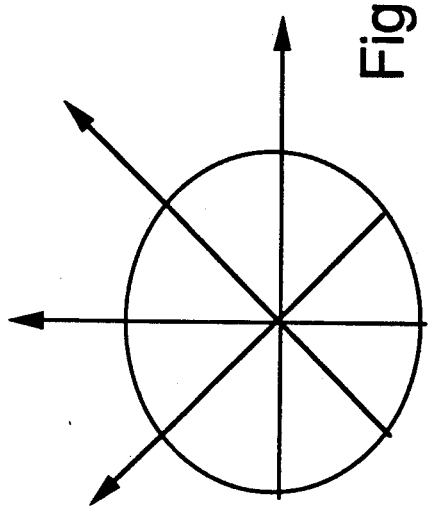
FIGS. 4a-4d illustrate the formation of precomputed data from which magnetic dipoles are detected and localized using the method and apparatus of the present invention.

Referring now to the drawings, FIG. 1 is a diagram illustrating the concepts of the method and apparatus of the present invention. In particular, FIG. 1 shows a portion of a detection and location system 10 which includes an array of magnetic sensors 11 that is coupled to processing apparatus (not shown in FIG. 1). The array of circular locations represent magnetic response locations 12 that are defined relative to the array of magnetic sensors 11. As will be more fully described below, the magnetic response locations 12 have precomputed magnetic responses associated therewith which represent the magnetic field that would result if a magnetic dipole were present within each particular magnetic response location 12 at a plurality of different orientations. Also shown in FIG. 1 is a particular magnetic response location 12a in which is located a magnetic dipole 13, represented by the submarine. Also a plurality of arrows representing magnetic vectors 14 are shown extending from each sensor of the array of magnetic sensors 11 toward the particular magnetic response location 12a in which the magnetic dipole 13 is located. Each sensors reading contributes a set of vectors indicative of the location of the magnetic dipole 13, thereby forming a sensed signature that is processed using the concepts of the present invention as described below.

Referring to FIG. 2, it shows a block diagram illustrating the processing steps utilized in the method and apparatus of the present invention. In particular, FIG. 2 shows the processing steps performed within the processing apparatus of the present invention. As shown in FIG. 2, in a first processing step 31, data from the array of sensors 11 is processed using a linear model to predict each sensor's value using the other sensors. In addition, in a second processing step 32, the data is time averaged to perform a long term integration thereof which operates as a low pass filter on the data. This data is used to adjust the values of the data computed in the first processing step 31. Furthermore, in a third processing step 33, the predicted data, as modified by the time averaged data, is subtracted from the measured data and the resultant data is expanded in terms of Anderson's functions in step 34. Prior to operational use of the present invention, and as is indicated in process step 35, stored data is generated in terms of the Anderson functions which comprise magnetic responses associated with each of the magnetic response locations 12 that represent the magnetic field that would result if a magnetic dipole were present within each particular magnetic response location 12.

The precomputed data generated in step 35 is then correlated with the resultant data generated in step 34 in processing step 36. This correlation comprises a dot product of the two sets of data, and the correlation produces sharply increased dot product values when the two data values are substantially the same, while producing relatively low values when the data is only moderately different. A maximum, or peak, correlated value is selected in processing step 37. A threshold is selected in step 38, say for example, 50% of the peak correlated value, and correlated and normalized signals above the threshold are displayed by interpolating the relative positions (locations) of the magnetic response location and displaying them on a monitor, for example, as is illustrated in steps 39 and 40.

Referring now to FIG. 3, it again illustrates the processing performed using the method and apparatus of the present invention in more detail and utilizing alternative terminology. Specifically, the data is temporally filtered in step 41. This is accomplished by the low pass filtering discussed with reference to FIG. 2. Spatially coherent fluctuations are removed in step 42. This is also accomplished by the low pass filtering discussed with reference to FIG. 2. Then spatial matched filtering is employed to determine the existence of magnetic dipoles in the detection region of the array of sensors 12. This is accomplished by the correlation step 36 discussed with reference to FIG. 2. Next the matched filtered data is processed using a square law detection scheme in step 44, and then this data is smoothed in step 45. The smoothed data is then thresholded and magnetic dipoles located in the data are localized in step 46. This corresponds to the threshold and interpolation steps 38, 39 discussed with reference to FIG. 2. Finally, the position of the detected magnetic dipoles are displayed for viewing by the user of the system 10.

Figure 4D:
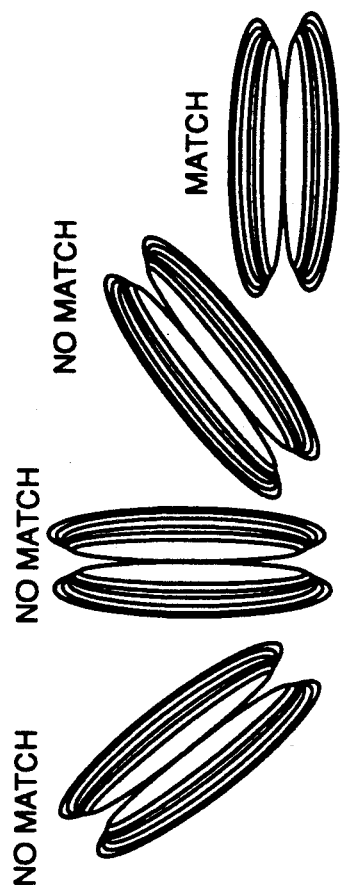
Figure 4A:
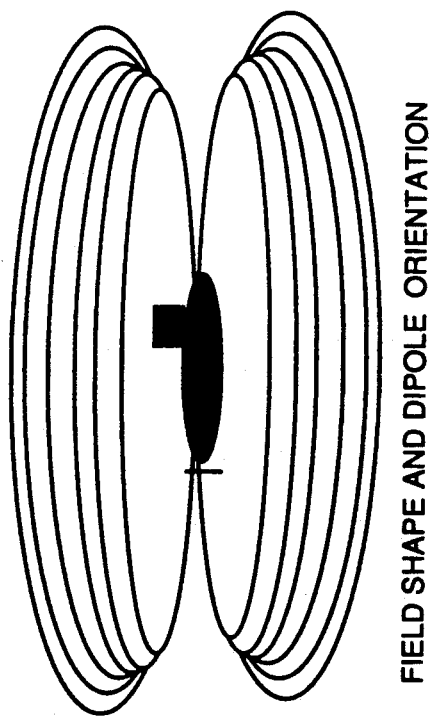
Figure 4C:
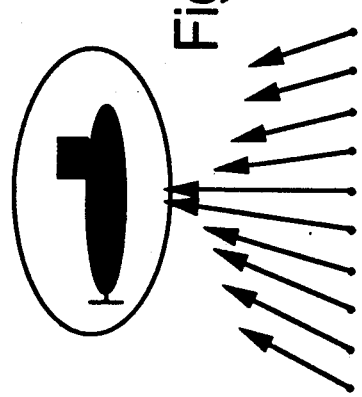

Referring to FIGS. 4a-4d, they show the formation of precomputed data from which magnetic dipoles are detected and localized using the method and apparatus of the present invention. FIG. 4a shows the field shape and dipole orientation associated with a particular magnetic dipole, shown as a submarine. FIG. 4b shows the precomputed dipole orientations for each magnetic response location identified in FIG. 1. In FIG. 4b, the dipole orientations are computed at every 45 degrees, and four orientations are shown. FIG. 4c illustrates the computation of contributions of each sensor of the array of sensors to each magnetic response location. The contributions are identified by the arrows pointing towards the submarine. FIG. 4d illustrates the matching of precomputed dipoles generated in FIG. 4b with the computed dipole generated from FIG. 4c. In particular, a match occurs when the precomputed and computed dipole orientations are aligned.

FIGS. 5a and 5b illustrate magnetic signature signals for two different dipole orientations, and in particular for output signals derived from two dimensional vector sensors (x, y). The output signatures shown in FIGS. 5a and 5b are clearly different for the two dipole orientations, and are thus discernable by using the techniques employed by the present invention.

FIG. 6 is a diagram illustrating an embodiment of the dipole moment detector and localizer system 10 in accordance with the present invention used to test the principles of the present invention. The complete system 10 comprises processing apparatus that includes a MacIntosh II computer 45 incorporating a sensor interface 46. A printer 47 and disk storage apparatus 48 is coupled to the computer 45 and are provided to permit storage and output of the data generated by the system 10. A test dipole comprising an electromagnet 50 that is coupled to an adjustable power source 49 is used as a target that is detectable by the array of sensors 11. The output of the array of sensors 11 is coupled by way of the sensor interface 46 to the computer 45 which has two separate computer programs operating therein. The first is a data acquisition program which accepts the sensor data and converts the data into signals that are processable by a second program that implements the processing steps outlined above with reference to FIGS. 2 and 3. The computer 45 includes a monitor on which is displayed the localized output of the program and shows the location of the electromagnet 50 as it is moved past the array of sensors 11.

In summary, the present invention employs a method that uses the array of magnetic sensors 11 to detect the presence of the dipole 13 within the field of the array. The method is based on the use of a set of functions proposed by Anderson in the late 1940's in a paper entitled "Magnetic Airborne Detection Frequency Responses", NADC Technical Report, Naval Air Development Center, Johnsville, Pa., 1949. However the aspects of the present invention are different from the Anderson approach in at least five ways.

First, the present invention is different from Anderson's original application in that it is based on the measurement of the magnetic field on a set of spatially distributed sensors rather than measurements on a single sensor over a period of time.

Second, the present invention uses the functions proposed by Anderson, hereafter called "Anderson functions" in a different way from other applications of these functions. This is because the inner product used for the expansion of the magnetic field in terms of these functions uses an arbitrary kernel function which is optimized for the particular application.

Third, the present processing method results in a set of responses (outputs), one for each hypothesized location of a dipole 13 relative to the array of sensors 11 and for each hypothesized orientation of the dipole. Only if the one of these responses is significantly different from zero, in comparison to the naturally occurring variations in the magnetic field surrounding the array of sensors 11, will a detection of the dipole 13 be declared. The present processing method uses interpolation of the responses to obtain a greater accuracy of location and dipole orientation.

Fourth, the present method reduces the naturally occurring variations in the magnetic field by exploiting their high degree of spatial correlation. This is accomplished by first determining and then subtracting the long term mean of the magnetic field from each of the sensor's measurements, then with a long term estimate of the cross-covariance of the sensors' outputs, in the absence of a dipole of interest, each sensor's output is estimated from the measurements on the other sensors using standard statistical estimation techniques, and this estimate is subtracted from the measurement at each time a new measurement is made. As used herein, a long term is meant to denote any time duration which is large compared to the time durations over which variations of the magnetic field due to the dipole 13 are expected to occur.

Fifth, the technique is applicable whether the magnetic field measurements are measurements of each of the vector components of the field at each sensor's location or whether they are measurements of the magnitude of the magnetic field at each such location. The difference in the two kinds of measurements is that a different set of Anderson functions and a possibly different kernel function is used, and the detection-localization performance is different.

Reference is made to FIG. 7 which illustrates a geometric arrangement representing a line of array of sensors along the X-axis with a particular search location defined with respect to parameters $y_1$ and theta that is useful in explaining the mathematics associated with processing performed in accordance with the present invention. FIG. 6 is used herein to help describe the mathematics associated with processing performed by the present invention.

If $x_{ij}$ is used to denote the measurement of the field (vector or magnitude) on sensor i at time j, then the measurement with the estimated mean subtracted $y_{ik}$ at time k is given by $$y_{ik} = x_{ik} - \left(\frac{1}{N}\right)\sum_{j}^{N} x_{i,k-j}$$

where N is the number of measurements over which the mean is estimated. The result of reducing the variations of the natural background magnetic field is for sensor i at time k $$z_{ik} = y_{ik} - \sum_{j\neq i} p_j y_{j,k}$$

These resulting measurements are expanded in terms of a set of Anderson functions which are derivable by expanding the field due to a dipole with respect to the geometrical situation shown in FIG. 7.

Here we have assumed that the sensors are distributed along a line in the x direction. A similar development is possible for any other spatial distribution, with the case of a distribution along a rectangular grid being of particular interest. The line array of sensors is used here for simplicity of illustration of the principles. The field due to a dipole is given by $$\vec{H} = \left(\frac{M}{r^3}\right)[3\vec{m}\cdot\vec{a_r}\vec{a_r} - \vec{m}]$$

$$H_x = \left(\frac{M}{y_1^3}\right)\left(2\vec{m}\cdot\vec{a}\frac{1}{(1+y^2)^{5/2}} + 3\vec{m}\cdot\vec{\beta}\frac{y}{(1+y^2)^{5/2}} - \right.$$

$$H_y = \left(\frac{M}{y_1^3}\right)\left(-\vec{m}\cdot\vec{\beta}\frac{1}{(1+y^2)^{5/2}} + 3\vec{m}\cdot\vec{a}\frac{y}{(1+y^2)^{5/2}} + 3\vec{m}\cdot\vec{\beta}\frac{y^2}{(1+y^2)^{5/2}}\right)$$

with a similar expansion for the z component if it is available. In this expression the lower case $\vec{a}$ vector is a unit magnitude vector in the direction of the dipole's location. $\vec{m}$ is the unit magnitude vector oriented with the dipole, M is the magnitude of the magnetic dipole moment, r is the distance to the dipole and $y_1$ is the perpendicular offset from the line of the sensor array to the dipole. The gamma symbol is defined to be the tangent function of the angle theta shown in FIG. 1. For this case the Anderson functions are chosen to be $$h_i = \frac{\gamma^i}{(1+\gamma^2)^{5/2}} \; ; i = 0, 1, 2; \gamma = \tan\theta = x/y_1$$
$$= \sin^i\theta \cos^{5-i}\theta.$$

For the case where the measurements are not made of the individual magnetic field components but rather of the magnitude of field (so-called total field case), the expansion we perform is of the magnitude-squared field $$|\vec{H}|^2 = \frac{M^2}{r^3}|3\vec{m}\cdot\vec{a}_r\vec{a}_r - \vec{m}|^2 =$$

$$\frac{M^2}{y_1^6}\left([3(\vec{m}\cdot\vec{a})^2 + 1]\frac{1}{(1+\gamma^2)^5} + 6(\vec{m}\cdot\vec{a})(\vec{m}\cdot\vec{\beta})\frac{\gamma}{(1+\gamma^2)^5} + [3(\vec{m}\cdot\vec{\beta})^2 + 1]\frac{\gamma^2}{(1+\gamma^2)^5}\right)$$

where now the Anderson functions are chosen to be $$h_{Tf,i} = \frac{\gamma^i}{(1+\gamma^2)^5} \; ; i = 0, 1, 2; y = \tan\theta = x/y_1$$

In neither case are the Anderson functions a complete orthonormal set (CONS) of functions with respect to the Lebesque measure of gamma or theta. For this reason we have chosen to generalize the definition of the inner product usually applied to Anderson function applications. We define the inner product with respect to a general kernel function k.

$$R_{ij} = \int h_i h_j k\, d\theta$$

Note that the integral is with respect to theta. It can be expressed in terms of an integral with respect to gamma by a change of variables. We have found that the output of our processing method depends usefully on the selection of a best kernel function k.

Because the selected Anderson functions are not orthogonal in general relative to the selected kernel function, the expansion coefficients of a function in terms of the Anderson functions are expressed in terms of integrals over the adjoint functions defined by $$h_{adj,k} = \sum_j R_{kj}^{-1} h_j$$

where $R^{-1}$ is the inverse of the inner product matrix defined above. The expansion of an arbitrary field in terms of the Anderson functions is given by $$\vec{H} = \sum_j \vec{d}_j h_j; \text{ where } \vec{d}_j = \int \vec{H} h_{adj,i}\, k d\theta$$

We now have expressions in terms of generalized Anderson functions for what the magnetic field of a dipole would be on a set of magnetic sensors if the dipole were located at $(x,y_1)$ with a particular orientation, phi. We also have a method of expanding the actual measurements in terms of these same Anderson functions. What we do next is form the products of the expected expansion coefficients (for a dipole located at a selected set of locations with a selected set of orientations) with the measured expansion coefficients (which are denoted by a subscript s)

$$J(\theta, y_1; \theta_s, y_s) = \sum_i \vec{d}_i(\theta, y_1)\cdot\vec{a}_{si}(\theta_s, y_s)$$

Because of the Cauchy-Schwarz inequality we can expect to find that this product is maximum when the two sets of expansion coefficients are equal except for a scale factor. In order to eliminate the strong dependence of the expected coefficients on the perpendicular offset distance $y_1$, the present processing procedure first sets the sum of squares of these coefficients for a particular location and orientation to one by dividing by the square-root of the sum of squares.

The following is a description that illustrates the generality of the magnetic detection and localization technique of the present invention. The method and the example describing the magnetic detection and localization technique of the present invention are based on a particular application of the principles disclosed; namely it has used a particular method of generating the response function, J, also known as and described as the correlation. For the correlation, it uses a particular formulation of an inner product, in which the measured and the computed magnetic responses are each expanded in terms of Anderson functions. This is indeed the preferred way of implementing the calculation of the response functions for the various chosen locations near the array of magnetic sensors, but we want to emphasize here that the present invention covers the more general concept.

The basic process used in generating the responses at the various chosen locations relative to the array is the following.

Form an estimate of the magnetic field on the array of magnetometers, if there were a magnetic dipole located at each of the various selected locations (these estimates are called the calculated values for the array magnetic fields).

Take measurements of the magnetic field at each of the field sensors (magnetometers) at the time we wish to detect and localize a possibly existent magnetic dipole within the field. We remove as much of the spatial and temporal variations caused by the naturally occurring background as is possible using the temporal and spatial smoothing techniques disclosed herein.

Correlate the measured values with each of the calculated values for the array magnetometers, where by the term correlate we mean the multiplication of the calculated array of values with the array of measurements and summing the results over the array of sensors (the values of these correlations for each selected location off of the array of sensors, expressed as a function of the actual dipole location is what is called the response function J for that selected location).

If one of the correlations resulting has a significantly larger value than the others and if it is greater than some predetermined threshold, a detection is declared for the location off of the array corresponding to the calculated values which resulted in the larger value of the correlation.

The Anderson function approach is the best way we have yet found for calculating the correlations (which can be calculated in various ways) and thus the best way of calculating the response functions. Thus we do claim to have found an efficient way of performing the correlation, but the magnetic detection and localization technique disclosed is more general; it works with any implementation of the correlation.

Expansion in terms of nonorthogonal functions: the Anderson functions as selected are not orthogonal since $$\int h_i h_j dF(\theta) = g_{ij} \neq \delta_{ij}$$

Let $$\sum_k G_{ik} g_{ik} = \delta_{ij}$$

Define G, and define a set of adjoint functions by $$h^i = \sum_j G_{ij} h_j = h_{ad,i}$$

The Anderson functions and these adjoint functions are orthogonal:

$$\int h^i h_k dF(\theta) = \int G_{ij} h_j h_k dF(\theta) = G_{ij} g_{ik} = \delta_{ik}$$

Therefore to find the coefficients of $h_k$ in the expansion of an arbitrary function multiply by the adjoint $h^k$ and integrate. For example, let A be given by:

$$A = a_1 h_1 + a_2 h_2 + a_3 h_3$$

then $$a_k = \int A h^k dF(\theta)$$

We can define an inner product and thus a Hilbert space by $$(A,B) = \left( \sum_i a_i h_i, \sum_j b_j h_j \right) = \int adj(A) B dF(\theta)$$

$$= \sum_{ij} a_i b_j \int h^i h_j dF(\theta)$$

$$= \sum_{ij} a_i b_j \delta_{ij} = \sum_i a_i b_j$$

Temporal gain results from matching the signal and noise bandwidths (Eckart filtering may be used). Spatial coherence gain removes fluctuations common to the sensors. Spatial matching gain arises from matching the spatial filter to the field of a dipole via Anderson functions. Post detection gain (track before detect gain) allows the use of a lower recognition differential (false alarms are controlled by requiring a viable or realistic track).

FIG. 8 illustrates a typical operational scenario utilizing the present invention. FIG. 8 shows a typical shore line including a harbor 65 having a shallow water shelf 60 located adjacent the harbor 65, and a deep water area 62 distal from the harbor 65. A plurality of submarines 13a, 13b, 13c are located in deep water, above the shallow water shelf, and at the harbor site. A control station 66 is located within the various areas adjacent the harbor 65 and includes a radar 68 that is adapted to detect and locate surface going vessels. An array of magnetic sensors 11 are disposed under the water at the base the shallow water shelf 60 and are positioned such that the sensor spacing gives full field coverage, although it is not specifically shown as such in FIG. 8. The array of sensors 11 may comprise passive acoustic, high frequency active acoustic or passive magnetic sensor. The array of sensors 11 are coupled to the control station 66 by way of cabling 69 and telemetry using conventional techniques well known in the sonar art. The multisensor data correlation techniques described above are implemented at the control station 66 to process the magnetic or acoustic sensor data. The system of FIG. 8 is employed to discriminate subsurface vessels from surface vessels. The system of FIG. 8 provides for shallow water subsurface vessel detection, harbor protection and friendly vessel delouse, particularly for slow moving undersea vessels such as the submarines 13, and the like.

Figure 9:
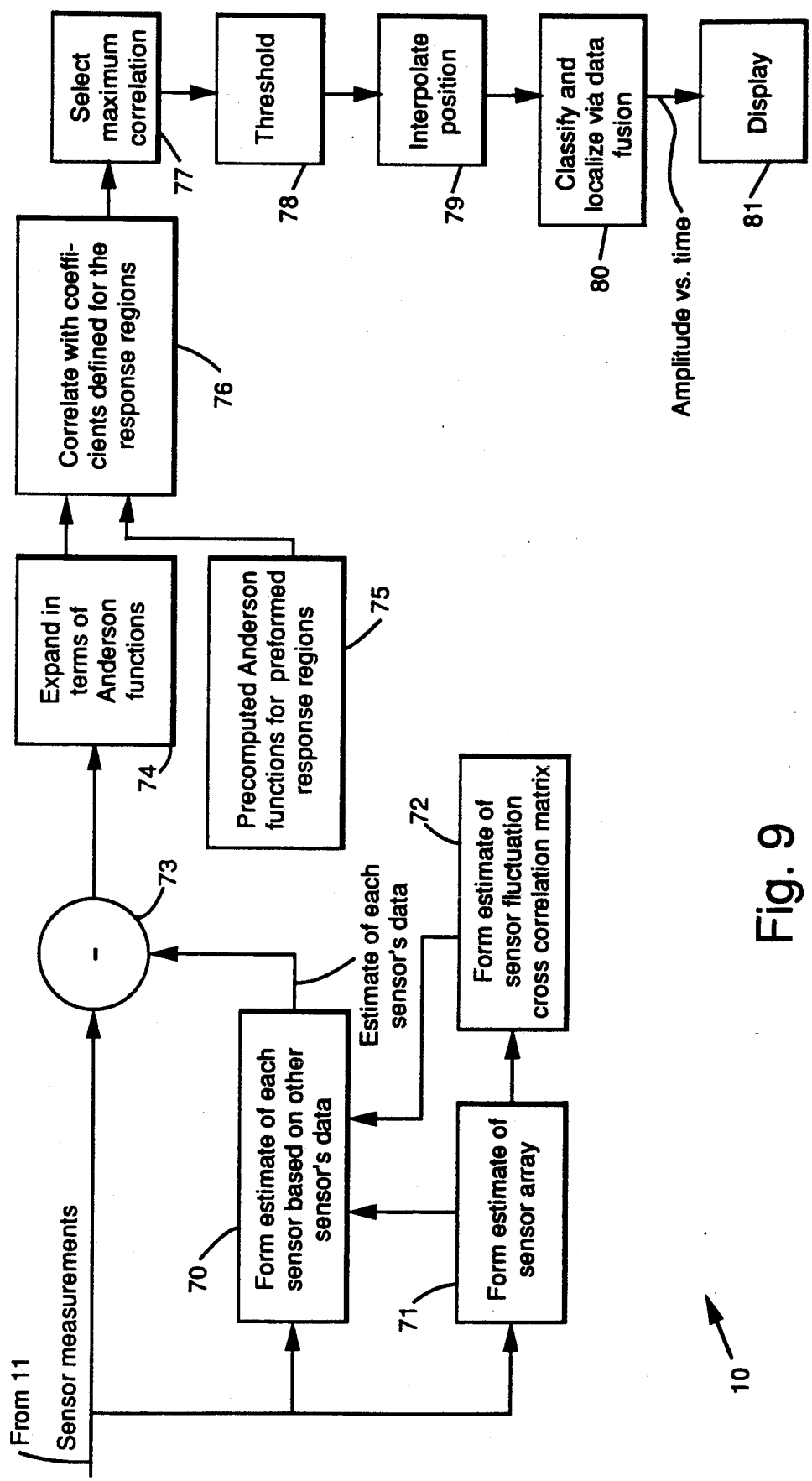
FIG. 9 is a block diagram illustrating the apparatus in accordance with the present invention.

FIG. 9 is a block diagram again illustrating the detection and location apparatus 10 of the present invention. In FIG. 9, magnetic sensor measurements are received from the array of sensors 11 and are processed such that estimates of each sensor's response based on all of the other sensor's data are determined, as is shown by estimate processing means 70. In order to accomplish this, an estimate is formed based on all sensors in the array of sensors 11 as shown by sensor estimation processing means 71. The output of the sensor estimation processing means 71 is utilized to form an estimate of sensor fluctuation cross correlation matrix, as is shown by sensor fluctuation cross correlation means 72. The output of the sensor estimation processing means 71 and the sensor fluctuation cross correlation means 72 is employed to form the estimate of each sensor response. The estimate of each sensor response are subtracted from the original magnetic sensor measurements, as is shown by the subtraction means 73. A large output signal is expected from the subtraction means 73 only if some anomaly occurs different from the historical statistics formed by computing the above estimated. The signal output from the subtraction means 73 is then expanded in terms of Anderson functions as is illustrated in expansion means 74. Precomputed Anderson functions for each of the preformed response regions that are stored in storage means 75 are correlated in correlation means 76. This amounts to a spatial match filtering of the output signals using the precomputed Anderson function data. The signal output comprising the spatially match filtered signals provided by the correlation means 76 which has a maximum correlation is selected in selection means 77. A threshold is set in thresholding means 78 and any signals above the threshold have their position determined by position interpolation means 79 and are classified and localized by localization means 80 and displayed on a monitor 81, for example. The output of the localization processing performed by the localization means 80 amounts to an amplitude versus time information that is indicative of the anomalies present in the magnetic field sensed by the array of sensors 11.

Typically, target data is hidden in background noise. When processing acoustic sensor data, signal conditioning hydrophone sensor data with no integration time and then acoustically processing the hydrophone sensor data by performing lone term integration as described above, a time versus frequency graph is produced wherein target data is highlighted by the long term integration process. Furthermore, when processing magnetometer data signal conditioned with no integration time, and then processing this data using the processing detailed in FIG. 9, the time versus amplitude graph is indicative of the anomalies present in the magnetic field sensed by the array of sensors 11.

Utilizing the above-described system and methodology, and processing data at a fixed site, provides for a system that has no geographical surprises, and reduced false alarms. The long term integration approach of the present invention is supported by the fixed position of the array of sensors 11 and the substantially nonmoving nature of the fixed site. The noise reduction aspects of the present invention is employed since knowledge may be generated about the geographical location, noise correlation which may be produced across all sensors in the array of sensors 11, and long term surveillance is compatible with the long term data integration aspects of the present invention. In addition, the system of the present invention is difficult to countermeasure. The permanent dipole moment of a suspected target may reduced through degaussing techniques, but the induced moment caused by the target movement through the earth's magnetic field cannot be minimized. Also, target size creates a large anomaly relative to the earth's magnetic field, which is detectable using the present invention.

FIG. 10 shows a more detailed version of the system 10 of the present invention, specifically for a vector sensor system whose sensors provide x, y and z sensor output measurements or signals. In FIG. 10, the array of sensors 11, comprising sensor 1 through sensor n, are individually coupled to axis alignment computation means 90 and low pass filtering means 91 to coherent spatial noise filtering means 92. The low pass filtering means 90 that corresponds to the portion of FIG. 9 comprising estimate processing means 70, sensor estimation processing means 71, and sensor fluctuation cross correlation means 72, 73. The coherent spatial noise filtering means 92 corresponds to the expansion means 74, the storage means 75 which stores the precomputed Anderson function values, and the correlation means 76 in FIG. 9.

The outputs of the coherent spatial noise filtering means 92, comprising sets of vector component signals (x1, y1, z1, . . . xn, yn, zn), are coupled to the dipole moment detector and localizer processing means 93. The dipole moment detector and localizer processing means 93 corresponds to that portion of the system of FIG. 9 comprising steps 74 and 75 relating to the computation of the Anderson function expressions, the correlation step 76, and the maximum correlation selection step 77. The dipole moment detector and localizer processing means 93 comprises a plurality of dip orientation match filters adapted to receive each of the component signals from the individual sensors of the array of sensors 11, which are coupled to a plurality of low pass filtering means 95 for false alarm reduction and then to selection means 96 which is adapted to select the maximum correlated value.

The output of the each of the selection means 96 of the dipole moment detector and localizer processing means 93 is then individually coupled through square law detection means 97, low pass filtering means 98, and threshold and localization processing means 78 to the display 81.

Thus there has been described new and improved dipole moment detectors and methods that provide for detection, localization and orientation of dipoles such as submarines and ocean going vessels, and the like. It is to be understood that the above-described embodiment is merely illustrative of some of the many specific embodiments which represent applications of the principles of the present invention. Clearly, numerous and other arrangements can be readily devised by those skilled in the art without departing from the scope of the invention.

What is claimed is:

1. A method of detecting and localizing a magnetic dipole using an array of spatially distributed magnetic sensors, said method comprising the steps of:

sensing the magnetic field produced by the magnetic dipole using the array of spatially distributed magnetic sensors;

processing output signals from each of the sensors that are indicative of the magnetic field sensed thereby and removing signals indicative of the earth's magnetic field therefrom;

generating a magnetic signature produced by the dipole which represents a magnetic response function of the dipole sensed by the array by the processing the output signals from each of the magnetic sensors to resolve the magnetic field into its magnetic field components; and processing the magnetic response function to produce magnetic signature features that are indicative of the location and relative orientation of the dipole.

2. A method of detecting and localizing a magnetic dipole using an array of spatially distributed magnetic sensors, said method comprising the steps of:

forming a normalized estimate of the magnetic field sensed by the array of sensors using known magnetic dipole orientations located at each of a plurality of preselected locations to provide an array of estimated signals;

processing the estimated signals to produce a first set of Anderson function expansion coefficients representative of each of the estimate signals, and storing the Anderson functions;

measuring the magnetic field at each of the sensors in the presence of the magnetic dipole that is detected to produce measured magnetic field signals;

removing spatial and temporal variations in the magnetic field measured at each of the sensors by temporally and spatially smoothing the measured magnetic field signals;

processing the temporally and spatially smoothed measured magnetic field signals to produce a second set of Anderson function expansion coefficients representative of each of the measured magnetic field signals;

correlating the first and second sets of Anderson function expansion coefficients to produce a response function for the magnetic dipole location;

identifying the location of the dipole if one of the correlations has a significantly larger value than the others, and if it is greater than a predetermined threshold, and the location of the dipole corresponds to the location represented by the measured magnetic field signals that produced in the significantly larger value.

3. A method of detecting and localizing a magnetic dipole using an array of spatially distributed magnetic sensors, said method comprising the steps of:

precomputing a plurality of magnetic field signatures that are representative of a magnetic field of a dipole when the magnetic dipole is located at each of a plurality of selected locations relative to the array, to provide calculated estimate values;

storing the calculated estimate values;

taking measurements of the magnetic field at each of the sensors in the presence of a magnetic dipole within the field that is to be detected;

removing the spatial and temporal variations present in the measured magnetic field caused by the naturally occurring background using temporal and spatial smoothing techniques;

correlating the measured values with each of the calculated estimate values for the array of sensors, by multiplying the calculated estimate values with the measured values and summing the results over the array of sensors; and if one of the resulting correlations has a significantly larger value than the others and if it is greater than a predetermined threshold, declaring a detection for the location corresponding to the calculated values which resulted in the larger correlation value.

4. Apparatus for detecting a vehicle comprising a magnetic dipole having two different magnetic poles and having magnetic field lines extending between the two different magnetic poles, said apparatus comprising:

a plurality of magnetic sensors arranged in a predetermined array configuration for sensing the vehicle comprising a magnetic dipole;

means coupled to the magnetic sensors, for storing an estimate of the magnetic field signature comprised of vectors that are detectable by the plurality of sensors using a known set of magnetic dipole orientations at each of a plurality of preselected locations to provide estimate signals that are represented by a first set of Anderson functions, and for processing sensed magnetic field signals indicative of the magnetic field measured at each of the sensors in the presence of the magnetic dipole being detected, and for removing spatial and temporal variations in the magnetic field measured at each of the sensors by temporally and spatially smoothing the measured magnetic field signals, and for processing the temporally and spatially smoothed magnetic field signals to produce a second set of Anderson functions representative of each of the magnetic field signals, and for correlating the first and second sets of Anderson functions by summing the results over the array of sensors to produce a response function for the magnetic dipole location, and for identifying the location of the dipole if one of the correlations has a significantly larger value than other correlation results, and if it is greater than a predetermined threshold, and the location of the dipole corresponds to the location represented by the measured magnetic field signals that produced the significantly larger value; and means coupled to the foregoing means for detecting the vehicle comprising a magnetic dipole and identifying its location, orientation and motion with respect to the magnetic sensors.

5. Apparatus for detecting and localizing a magnetic dipole having opposite polarity magnetic poles and having magnetic field lines extending therebetween, said apparatus comprising:

a plurality of magnetic sensors arranged in a predetermined spatially distributed field such that each of the sensors provides output signals indicative of vectors resulting from the magnetic field of the magnetic dipole being detected;

means coupled to said sensors for generating a magnetic signature based on the vectors resulting from the magnetic field of the magnetic dipole being detected, the magnetic signature representing a magnetic response function of the magnetic dipole based upon the resolution of the magnetic field vectors into their magnetic field components; and detecting and localizing the magnetic dipole by correlation of predetermined features in the magnetic response function that are indicative of the location and relative orientation of the magnetic dipole.

6. Apparatus for detecting and localizing a magnetic dipole comprising:

an array of spatially distributed magnetic sensors for sensing the magnetic dipole that each provide output signals that are indicative of the magnetic field sensed thereby;

computer means for generating a magnetic signature of the magnetic field of the magnetic dipole by resolving the sensed magnetic field into its magnetic field components, and for generating magnetic signature features that are indicative of the location and relative orientation of the dipole.

* * * * *